US010007197B2

(12) United States Patent
Lof et al.

(10) Patent No.: US 10,007,197 B2
(45) Date of Patent: Jun. 26, 2018

(54) SENSOR SYSTEM, SUBSTRATE HANDLING SYSTEM AND LITHOGRAPHIC APPARATUS

(71) Applicant: ASML Netherlands B.V., Veldhoven (NL)

(72) Inventors: Joeri Lof, Eindhoven (NL); Joost Kauffman, Enschede (NL); Martin Dieter Nico Peters, Veldhoven (NL); Petrus Theodorus Rutgers, Hengelo (NL); Martijn Hendrikus Wilhelmus Stopel, Enschede (NL); Gerard Van Den Eijkel, Enschede (NL); Harmen Klaas Van Der Schoot, Vught (NL); Raimond Visser, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 54 days.

(21) Appl. No.: 15/121,719

(22) PCT Filed: Mar. 2, 2015

(86) PCT No.: PCT/EP2015/054276
§ 371 (c)(1),
(2) Date: Aug. 25, 2016

(87) PCT Pub. No.: WO2015/135782
PCT Pub. Date: Sep. 17, 2015

(65) Prior Publication Data
US 2016/0370716 A1 Dec. 22, 2016

(30) Foreign Application Priority Data
Mar. 12, 2014 (EP) .................................... 14159143

(51) Int. Cl.
*G03F 7/20* (2006.01)
*G03F 9/00* (2006.01)
(Continued)

(52) U.S. Cl.
CPC ........ *G03F 7/70775* (2013.01); *G01B 11/272* (2013.01); *G03F 7/7075* (2013.01);
(Continued)

(58) Field of Classification Search
CPC . G01B 11/272; G03F 7/7075; G03F 7/70775; G03F 9/7011; H01L 21/681;
(Continued)

(56) References Cited

U.S. PATENT DOCUMENTS 4,376,581 A * 3/1983 Mayer ....................... G03F 9/70
355/41
5,212,880 A 5/1993 Nishiguchi et al.
(Continued)

FOREIGN PATENT DOCUMENTS

CN 1659695 8/2005
CN 102842485 12/2012
(Continued)

OTHER PUBLICATIONS

European Office Action dated Aug. 9, 2017 in corresponding European Patent Application No. 15707146.5.
(Continued)

*Primary Examiner* — Steven H Whitesell Gordon
(74) *Attorney, Agent, or Firm* — Pillsbury Winthrop Shaw Pittman LLP (57) ABSTRACT

A sensor system configured to determine a position of a substrate having an edge. The sensor system includes a radiation source arranged to emit a radiation bundle, a reflective element, a detector device and a substrate table having a supporting surface for supporting the substrate. The supporting surface is at least partly along a plane. The radiation source and the detector device are arranged on a first side of the plane. The reflective element is arranged on a second side of the plane other than the first side. The
(Continued)

reflective element is arranged to create a reflected bundle by reflecting the radiation bundle. The reflective element is arranged to illuminate the edge with the reflected bundle. The detector device is arranged to receive the reflected bundle.

20 Claims, 5 Drawing Sheets

(51) Int. Cl.
  *H01L 21/68* (2006.01)
  *H01L 21/687* (2006.01)
  *G01B 11/27* (2006.01)
  *H01L 21/66* (2006.01)
(52) U.S. Cl.
  CPC .......... *G03F 9/7011* (2013.01); *H01L 21/681* (2013.01); *H01L 21/682* (2013.01); *H01L 21/68707* (2013.01); *H01L 22/12* (2013.01)
(58) Field of Classification Search
  CPC .. H01L 21/682; H01L 21/68707; H01L 22/12
  See application file for complete search history.

(56) References Cited

U.S. PATENT DOCUMENTS

| | | | |
|---|---|---|---|
| 5,644,400 A | | 7/1997 | Mundt |
| 5,737,441 A | * | 4/1998 | Nishi .................... G06K 9/3216 347/3 |
| 6,162,008 A | | 12/2000 | Perkins et al. |
| 7,307,695 B2 | | 12/2007 | Hazenberg et al. |
| 2003/0072645 A1 | * | 4/2003 | Murray ................. H01L 21/681 414/754 |
| 2004/0043514 A1 | * | 3/2004 | Mayo .................... H01L 21/681 438/1 |
| 2005/0140960 A1 | | 6/2005 | Hazenberg et al. |
| 2007/0045566 A1 | | 3/2007 | McGinley et al. |
| 2008/0013089 A1 | * | 1/2008 | Ishii ...................... G03F 9/7011 356/400 |
| 2009/0097041 A1 | * | 4/2009 | Heiden ................ G01B 11/005 356/616 |
| 2011/0157352 A1 | | 6/2011 | Liu et al. |
| 2012/0268585 A1 | * | 10/2012 | Markwort .......... G01N 21/9501 348/87 |
| 2015/0287625 A1 | * | 10/2015 | Fujimoto ............. G01B 11/002 382/151 |
| 2016/0078612 A1 | * | 3/2016 | Kodama .............. G06T 7/0044 382/151 |

FOREIGN PATENT DOCUMENTS

| | | |
|---|---|---|
| JP | 08-298240 | 11/1996 |
| JP | 10-144748 | 5/1998 |
| JP | 2002-184665 | 6/2002 |
| JP | 2008-039413 | 2/2008 |
| KR | 10-2007-0064950 | 6/2007 |
| WO | 00/75969 | 12/2000 |
| WO | 2006/025386 | 3/2006 |

OTHER PUBLICATIONS

Singapore Written Opinion dated Feb. 6, 2017 in corresponding Singapore Patent Application No. 11201606867Q.
International Search Report and Written Opinion dated Jun. 9, 2015 in corresponding International Patent Application No. PCT/EP2015/054276.
Chinese Office Action dated Mar. 28, 2017 in corresponding Chinese Patent Application No. 201580012769.8.
Japanese Office Action dated Oct. 31, 2017 in corresponding Japanese Patent Application No. 2016-557006.
Singapore Examination Report dated Nov. 10, 2017 in corresponding Singapore Patent Application No. 11201606867Q.
Chinese Office Action dated Nov. 7, 2017 in corresponding Chinese Patent Application No. 201580012769.8.
Korean Office Action dated Dec. 15, 2017 in corresponding Korean Patent Application No. 10-2016-7025486.

* cited by examiner

SENSOR SYSTEM, SUBSTRATE HANDLING SYSTEM AND LITHOGRAPHIC APPARATUS

CROSS-REFERENCE TO RELATED APPLICATIONS

This application is the U.S. national phase entry of PCT patent application no. PCT/EP2015/054276, which was filed on Mar. 2, 2015, which claims the benefit of priority of EP application no. 14159143.8, which was filed on Mar. 12, 2014, and which is incorporated herein in its entirety by reference.

BACKGROUND

Field of the Invention

The present invention relates to a sensor system, a substrate handling system and a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic process accurate positioning of the substrate is required in order to properly transfer the pattern from the patterning device to the substrate.

In a known method to align the substrate, the alignment is done in two steps. In a first step, a pre-alignment step is done to correct for coarse angular and translational mispositioning. In a second step, die alignment is done that provides precision location keyed to specific features on the individual semiconductor die.

A known method of pre-alignment is to transfer the substrate onto a pre-alignment substrate table where it is rotated while the radial distance from substrate edge to center of the substrate table is measured. The sequence of these radial measurements is used to determine the centering of the substrate on the substrate table, a translational position of the substrate, and the location of marks or notches on a periphery of the substrate which defines a rotational orientation of the substrate. The movement of the substrate table assures rotational alignment, and the gripping device that then transfers the substrate to the substrate table where the actual lithographic process takes place compensates for its translational misalignment.

In this way, pre-alignment system may for example be able to align the substrate to within a degree of rotation and ten thousandths of a centimeter in translation.

In a known embodiment of a sensor system configured to determine the position of a substrate edge, the sensor system comprises a radiation source and a detector device, wherein the sensor and the detector device are arranged at opposite sides of the substrate.

In such sensor system, typically the detector device is arranged below the substrate and the radiation source, also called back radiation source is arranged above the substrate. As a result, energy transmitting cables and/or radiation transmitting cables have to be provided above the substrate which may be disadvantageous as the available space above the substrate is limited. Also, the presence of the radiation source above the substrate may result in heat dissipation and ineffective radiation radiation at an undesirable location. Further, the presence of cables and a radiation source above the substrate may create an obstruction of air downflow on the substrate.

Another known sensor system is disclosed in Unite States patent application US2007/0045566A1. This sensor system is arranged to determine the position of the edge of a substrate. The sensor system has a light source and a sensor. The sensor receives light reflected from the bottom surface of the substrate. However, the shape of the bottom surface may be different near the edge than elsewhere on the substrate. The difference in shape changes the optical properties of the substrate near the edge. Because of the change in optical properties, the known sensor system does not provide a defined way to align a wafer.

SUMMARY

Generally, in a lithographic process, it is desirable to provide a system and method that may improve the accuracy and reliability of the (pre-)alignment of a substrate in a lithographic apparatus. Further, it is desirable that the (pre-) alignment system occupies little space above the substrate and/or does not introduce disturbing effects, such as heat above the substrate or obstruction of air downflow.

According to an embodiment of the invention, there is provided a sensor system configured to determine a position of a substrate having an edge. The sensor system comprises a radiation source arranged to emit a radiation bundle, a reflective element, a detector device and a substrate table having a supporting surface for supporting the substrate. The supporting surface is at least partly along a plane. The radiation source and the detector device are arranged on a first side of the plane. The reflective element is arranged on a second side of the plane other than the first side. The reflective element is arranged to create a reflected bundle by reflecting the radiation bundle. The reflective element is arranged to illuminate the edge with the reflected bundle. The detector device is arranged to receive the reflected bundle.

According to an embodiment of the invention, there is provided a substrate handling system, comprising the sensor system mentioned above. The substrate handling system further comprises a gripping device configured to transfer the substrate to or from the substrate table. The gripping device comprises a gripper mark. The radiation source is arranged to illuminate with the radiation bundle the gripper mark. The radiation source is arranged to create a fourth reflected bundle by reflecting the radiation bundle via the gripper mark. The objective lens system is arranged to propagate the fourth reflected bundle so as to project an image of the gripper mark on the detector device.

According to an embodiment of the invention, there is provided a lithographic apparatus, comprising the sensor system mentioned above or the substrate handling system mentioned above. The lithographic apparatus further comprises a projection system arranged to project a pattern on the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
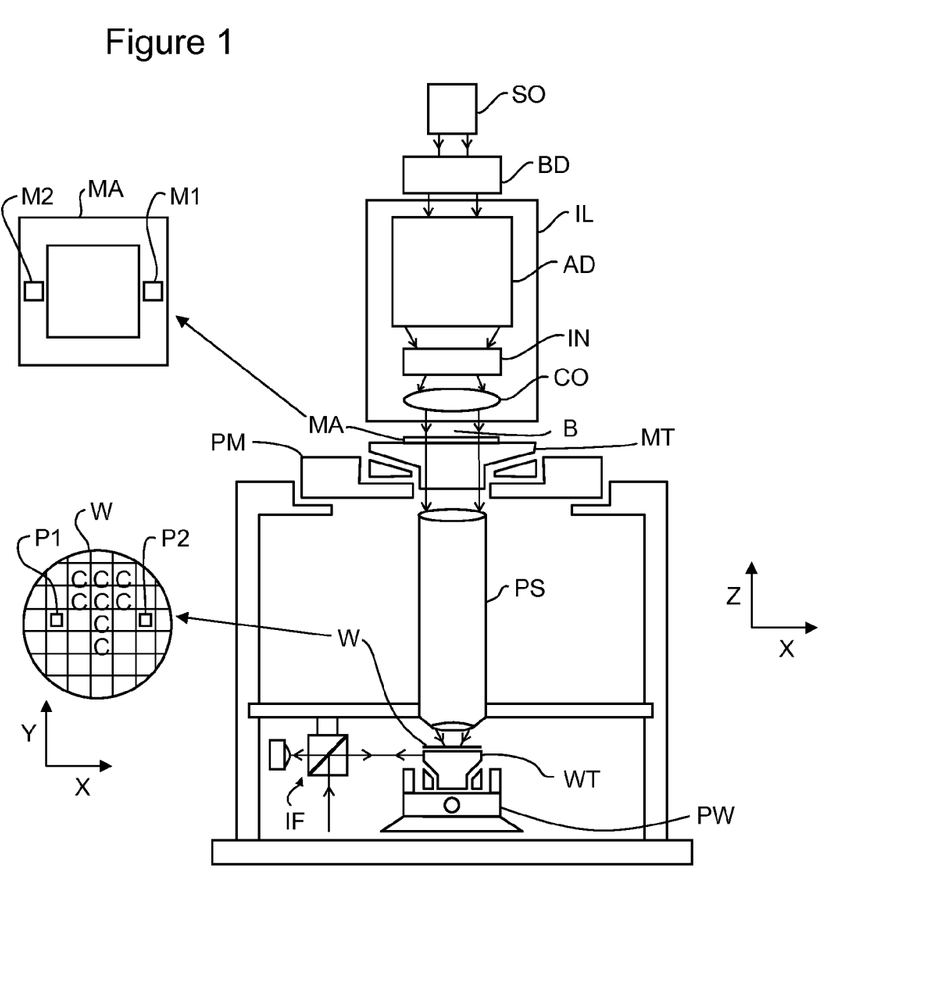
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The terms radiation beam used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The mask support structure MT supports, i.e. bears the weight of, the patterning device MA. The mask support structure MT holds the patterning device in a manner that depends on the orientation of the patterning device MA, the design of the lithographic apparatus, and other conditions, such as for example whether or not the patterning device MA is held in a vacuum environment. The mask support structure MT can use mechanical, vacuum, electrostatic or other clamping techniques to hold the patterning device MA. The mask support structure MT may be a frame or a table, for example, which may be fixed or movable as required. The mask support structure MT may ensure that the patterning device MA is at a desired position, for example with respect to the projection system PS.

The term "patterning device" used herein should be broadly interpreted as referring to any device that can be used to impart a radiation beam with a pattern in its cross-section so as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. The lithographic apparatus may have at least one substrate table WT and a measurement table. The measurement table may be provided with a sensor to measure a property of the projection system PS. The measurement table may be unsuited to hold a substrate W.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques can be used to increase the numerical aperture of the projection system PS. The term "immersion" as used herein does not mean that a structure, such as a substrate W, must be submerged in liquid, but rather only means that a liquid is located between the projection system PS and the substrate W during exposure.

Referring to FIG. 1, the illuminator IL receives a radiation beam from a source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA, which is held on the mask support structure MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module and a short-stroke module, which form part of the first positioning device PM. The long-stroke module is arranged to move the short-stroke module relative to the projection system PS over a large range. The short-stroke module is arranged to move the mask support structure MT relative to the long-stroke module over a small range with a high accuracy. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. These spaces between target portions C are known as scribe-lane alignment marks. Similarly, in situations in which more than one die is provided on the patterning device MA, the mask alignment marks M1, M2 may be located between the dies.

The depicted apparatus could be used in at least one of the following three modes:

The first mode is the so-called step mode. In step mode, the mask support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

The second mode is the so-called scan mode. In scan mode, the mask support structure MT and the substrate table WT are scanned synchronously while a pattern imparted to the radiation beam is projected onto a target portion C (i.e. a single dynamic exposure). The velocity and direction of the substrate table WT relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In the third mode, the mask support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
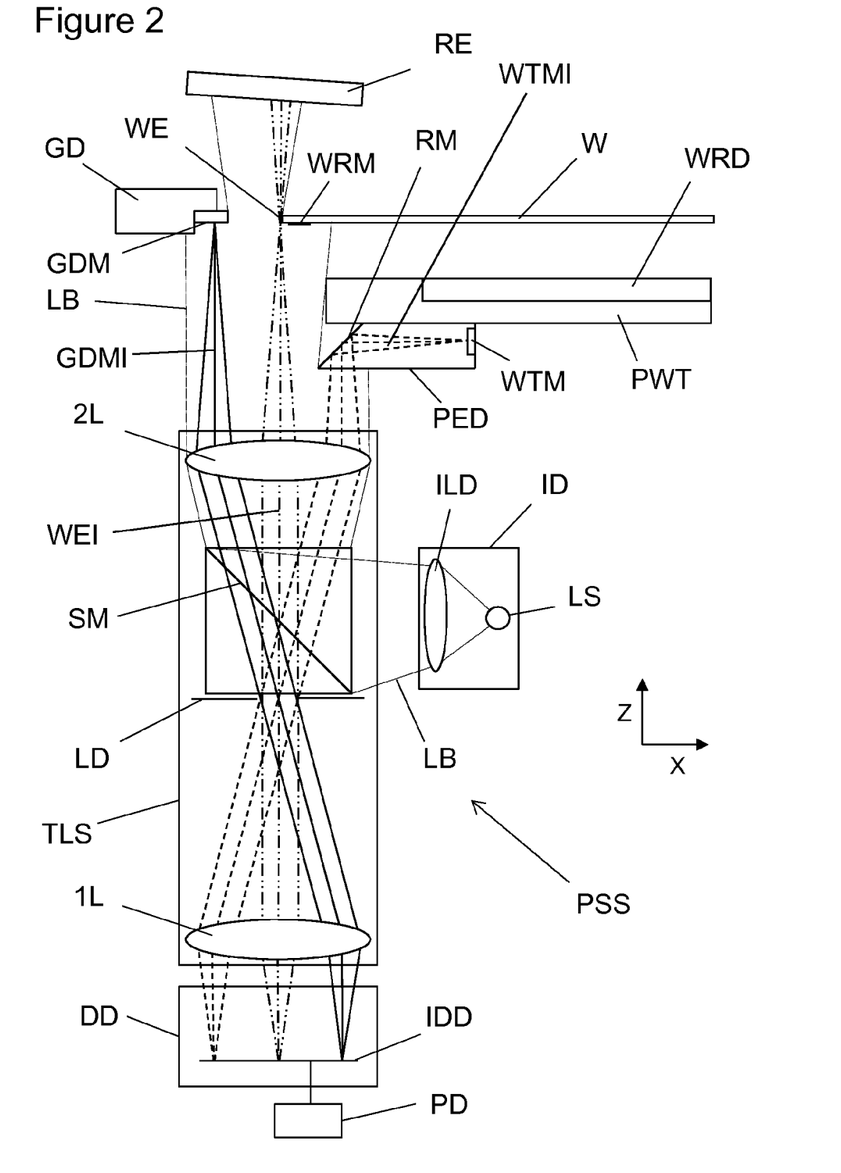
FIG. 2 depicts schematically a sensor system according to an embodiment of the invention.

The present invention relates to a sensor system, and a substrate handling system and a lithographic apparatus in which such sensor system may be used. FIG. 2 shows the sensor system PSS to determine a position of a substrate W. FIG. 2 shows part of a substrate handling system to align a substrate W with sufficient accuracy such that a fine alignment can be done later on. However, if the alignment accuracy of the embodiment of FIG. 2 is sufficient, no further alignment may be needed. The sensor system PSS may also be used in any other position measurement applications.

The substrate W may be supported by a pre-alignment substrate table PWT, or held by a gripping device GD. The substrate W comprises a substrate edge WE and a substrate rotational position mark WRM indicative for a rotational position of the substrate W. Such substrate rotational position mark WRM is known in the art.

The substrate handling system comprises a sensor system PSS configured to determine a position of the substrate W with respect to the pre-alignment substrate table PWT and/or the gripping device GD. This position is determined by determining a position of the substrate edge WE and a position of a substrate rotational position mark WRM. It is remarked that instead of a substrate rotational position mark WRM also a notch or other indicator of the rotational position of the substrate W may be used.

The shown substrate W has a substantially circular plate shape, but may also have any other shape or size.

The accuracy of the determined position may be relatively coarse and is mainly used to properly position the substrate W on the substrate table WT on which the actual lithographic process takes place and to provide information to the lithographic apparatus on the coarse position of the substrate W. Nevertheless, it is desirable that this coarse position information is relatively accurate.

The pre-alignment substrate table PWT is used to determine a position of the substrate W. When the rotational position of the wafer W is determined, it may be desirable to adjust the rotational position of the wafer W to a desired position. For this reason the pre-alignment substrate table PWT is provided with a substrate rotation device WRD, which may rotate the substrate to the desired position. The substrate rotation device WRD may also be configured to adjust a translational position of the substrate W (in the x-direction and/or y-direction).

In alternative embodiments other position adjustment devices, such as a rotating gripping device, rotating lifting pins or a rotating substrate table, may be provided to adapt the position of the substrate W.

The gripping device GD is configured to take the substrate W from the pre-alignment substrate table PWT and transfer the substrate W to a next process position of the lithographic process. Typically, the substrate W is transferred to the substrate table WT where the actual lithographic process takes place, i.e. the transfer of the pattern from the patterning device to the substrate.

During take-over from the pre-alignment substrate table PWT to the gripping device GD, some take-over inaccuracy may occur which results in that the measured position of the substrate W on the pre-alignment substrate table PWT and therewith the assumed position on the gripping device GD may not be completely accurate. Therefore, it is proposed to provide at least one gripping device mark GDM on the gripping device GD, such that the position of the substrate W with respect to the gripping device GD can directly be measured using the sensor system PSS as will be explained hereinafter. However, the sensor system PSS may also be used to determine a position of a substrate W only with respect to the pre-alignment substrate table PWT, or with respect to any other supporting device where pre-alignment measurement, or more generally position measurement, is desirable.

When the sensor system PSS is only used to determine a position of a substrate W with respect to the pre-alignment substrate table PWT the sensor system PSS does not have to be configured to measure a gripping device mark GDM and no gripping device marks GDM have to be provided on the gripping device GD.

The sensor system PSS is configured to determine a position of a substrate W by measuring a position of the substrate edge WE and by determining a rotational position of the substrate W by measuring a position of the substrate rotational position mark WRM. During measurement of the substrate edge WE and measuring a position of the substrate rotational position mark WRM, the substrate W may be rotated on the substrate table WT by the substrate rotation device WR. The pre-alignment substrate table PWT may be arranged to rotate the substrate W from a first orientation to a second orientation. In the first orientation a first portion of the edge WE may be illuminated by the reflective element RE. In the second orientation a second portion of the edge WE may be illuminated by the reflective element RE. The first portion is different from the second portion. To rotate the substrate W, the pre-alignment substrate table PWT may be provided with a substrate rotating device WRD. However, in an alternative embodiment, in which e.g. the sensor system PSS is a 2D sensor, rotation of the substrate table may not be required in order to determine a position of the substrate with respect to the substrate table PWT, in particular when multiple sensor systems PSS are used to determine a position of the substrate W.

The sensor system PSS comprises a radiation source LS, an imaging system TLS, a reflective element RE, and a detector device DD.

The radiation source LS, imaging system TLS and the detector device DD are arranged below the substrate W. The reflective element RE, for example a mirror element, is the only element of the sensor system PSS that is mounted above the substrate W. Since this reflective element RE is a stationary inactive element which does not require electricity, there is no need for cables towards the reflective element RE. Furthermore, the reflective element RE may be relatively small which is advantageous for air downflow on the substrate W. Also, the reflective element RE will have substantially no heat dissipation or stray radiation towards the wafer die surface. A further benefit is that a good illumination of the substrate edge WE is achieved independently of the shape of the surface of the substrate W near the substrate edge WE. Because the reflective element RE illuminates the substrate edge WE from above, a part of the illumination light is blocked by the substrate W from propagating to the detector device DD whereas another part of the illumination light is not. A clear image of the substrate edge WE can be made independent of the shape of the surface of the substrate W near the substrate edge WE. In comparison, the known sensor system of US2007/0045566A1 is sensitive to a change in the reflectivity of the substrate surface near the edge caused by the shape of the surface. Depending on the reflectivity, the position of the edge of the substrate may be determined incorrectly.

The pre-alignment substrate table PWT may have a supporting surface for supporting the substrate W. The supporting surface may be at least partly along a plane. The radiation source LS and the detector device may be on a first side of the plane, e.g. below the plane. The reflective element RE may be on a second side of the plane, other than the first side, e.g. above the plane.

The radiation source LS is part of an illumination device ID may further comprise a lens and diffuser ILD. The illumination device comprises a LED light source, but any other suitable radiation source type, such as infrared may also be used. The illumination device ID is configured to emit a radiation bundle LB towards the imaging system TLS.

The imaging system TLS may comprise a half-mirror SM, a diaphragm device LD, a first lens 1L and a second lens L2, preferably in a telecentric configuration. The imaging system TLS may comprise a telecentric imaging system. The half-mirror SM is arranged and configured to redirect the radiation bundle LB in a main direction of the imaging system, in this example a vertical direction Z towards the substrate W.

The imaging system TLS is configured to pass the radiation bundle LB from the illumination device ID towards for example the substrate edge WE and receive the radiation bundle after reflection on the substrate edge WE or other elements to guide the reflected radiation bundle LB to the detector device DD.

The diaphragm device LD is configured to provide a diaphragm opening through which the reflected radiation bundle may pass to the first lens 1L and the detector device DD.

The imaging system TLS is preferably a telecentric imaging system in order to obtain a proper focus range. However, any other type of suitable imaging system may also be used.

There is a length difference in the optical path between the imaging system TLS and the substrate edge WE at one hand and between the imaging system TLS and the substrate table PWT at the other end. This optical path difference may lead to focus problems in the accurate imaging of both the substrate edge WE and the substrate table mark WTM. To avoid such focus problem an optical path extension device PED is mounted at the bottom side of the pre-alignment substrate table PWT.

This optical path extension device PED comprises a mirror surface RM at an angle of approximately 45 degrees with respect to the z-direction to redirect the radiation bundle LB in another direction (x-direction), substantially perpendicular to the z-direction, towards the substrate table mark WTM mounted in the optical path extension device PED. The distance that the radiation bundle LB runs in the x-direction, from the mirror surface RM to the substrate table mark WTM, is selected to substantially correspond with the length difference in optical paths between the imaging system LTS and the substrate edge WE at one hand and between the imaging system TLS and the substrate table PWT at the other end, such that the length of the optical path from the imaging system TLS to the substrate edge WE and from the imaging system TLS to the substrate table mark WTM substantially correspond.

As the gripping device mark GDM is arranged at substantially the same height as the substrate edge WE an optical path extension device may not be required on the gripping device GD. However, when the gripping device GD, in particular the gripping device mark GDM, would be arranged, in the measurement direction, at a substantially different distance from the imaging system TLS than the substrate edge WE, an optical path extension device may also be mounted on the gripping device GD to compensate for this length difference in optical paths.

The reflective element RE may have straight mirror surface having a tilt angle with respect to the vertical z direction.

In alternative embodiments, the reflective element RE may comprise a diffuse reflecting surface or an a-spherical shaped mirror. In these embodiments, the reflective element RE may not have to be arranged at a tilt angle with respect to the vertical z-direction.

The detector device DD may comprise a two dimensional sensor device IDD, for example a CMOS or CCD camera sensor, capable of capturing a two dimensional image projected on the detector device DD. A processing device PD is provided to process the images captured by the sensor device IDD.

The imaging of the sensor system PSS will now be described. The radiation bundle LB emitted by the radiation source LS will be transmitted through the lens and diffuser ILD, and received by the imaging system TLS where the direction of the radiation bundle LB is redirected by the half-mirror SM in the z-direction towards the second lens 2L, where the radiation bundle LB leaves the imaging system TLS.

Different parts of the radiation bundle LB will fall on different elements of the sensor system PSS, marks or the substrate W, where at these elements the respective parts of the radiation bundle LB are reflected back to the imaging system TLS and via the imaging system TLS to the detector device DD. Thus, the radiation bundle LB that is emitted by the radiation source LS and the reflected radiation bundle both run through the imaging system TLS, i.e. so-called through the lens illumination (TTL) is used in this embodiment.

However, in an alternative embodiment also an illumination device may be used that directly emits a radiation bundle towards the different elements of the sensor system PSS, marks or the substrate W.

In the radiation bundle LB of FIG. 2, a left side part of the radiation bundle LB is reflected by the gripping device mark GDM. A right side part of the radiation bundle LB is reflected, via the optical path extension device PED, by the substrate table mark WTM. A middle part of the radiation bundle LB falls on the substrate edge WE. A right middle part is reflected by the substrate W and a left middle part is reflected by the reflective element RE. The reflection of the left side part of the radiation bundle LB by the gripping device mark GDM results in that an image of the gripping device mark GDM, i.e., gripping device mark image GDMI, is reflected back to the imaging system TLS. The reflection of the right side part of the radiation bundle LB by the substrate table mark WTM results in that an image of the substrate table mark WTM, i.e., substrate table mark image WTMI, is reflected back to the imaging system TLS. The reflection of the middle part of the radiation bundle LB results in that an image of the substrate edge WE, i.e., substrate edge image WEI is reflected back to the imaging system TLS.

In the imaging system TLS the reflected radiation bundle runs through the second lens 2L, the half mirror SM where the radiation bundle is transmitted, the diaphragm device LD and the first lens 1L where the reflected radiation bundle LB leaves the imaging system TLS. The reflected radiation beam LB leaving the imaging system TLS is received by the sensor device IDD of the detector device DD where the images of the different parts are formed on the sensor device IDD.

Figure 3:
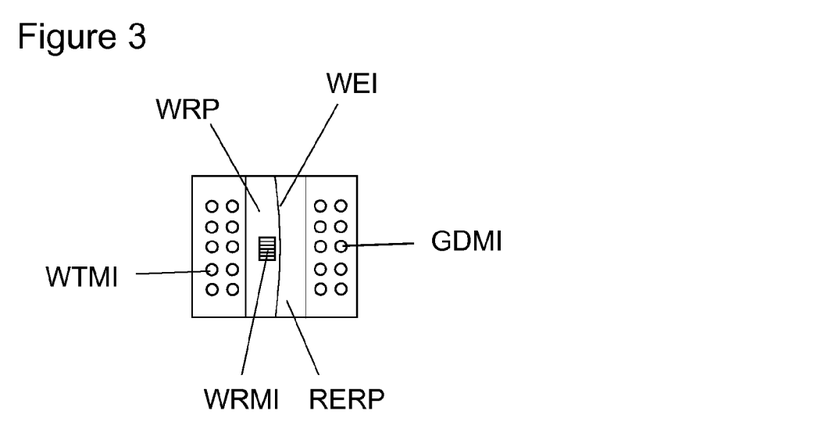
FIG. 3 depicts schematically an image as projected on the detector device.

FIG. 3 shows a complete image as received by the sensor device IDD. The image comprises, at the right side the gripping device mark image GDMI, at the left side the substrate table mark image WTMI, and in the center part of the image a substrate edge image WEI. This substrate edge image WEI is formed by intensity differences in the image between a first reflection part WRP reflected by the substrate W and a second reflection part RERP reflected by the reflective element RE.

The image as formed on the sensor device IDD further comprises a substrate rotational position mark image WRMI of the substrate rotational position mark WRM which can be used to determine a rotational position of the substrate W. In an alternative substrate design the substrate W may be provided with a notch in the substrate edge WE. Such notch can be recognized in the substrate edge image WEI. Any other indicator for the rotational position of the substrate W may also be used.

The information of the image received by the detector device DD can be used, for instance by the processing device PD, to determine a position of the substrate edge WE and a rotational position of the substrate W with respect to the substrate table WT, and, when the substrate W is held by the gripping device GD with respect to the gripping device GD. As explained above, the possibility to determine the position of the substrate W directly with respect to the gripping device GD may further improve accuracy with which the substrate W is placed on the substrate table used in the actual lithographic process.

As described above, and shown in FIG. 4, the reflective element RE, in particular its reflective mirror surface is arranged at an angle γ with respect to the z direction. This angle γ is required to ascertain that the complete second reflection part RERP reflected by the reflective element RE of the substrate edge image WEI falls within the part of the radiation bundle LB projected on the reflective element RE. In other words, the illumination numerical aperture (or illumination NA) with which the wafer edge is illuminated is close to, matching or preferably larger than the imaging numerical aperture (or imaging NA) of the reflected radiation bundle received by the detection device DD. The illumination numerical aperture may be at least two times larger than the imaging numerical aperture.

Figure 4:
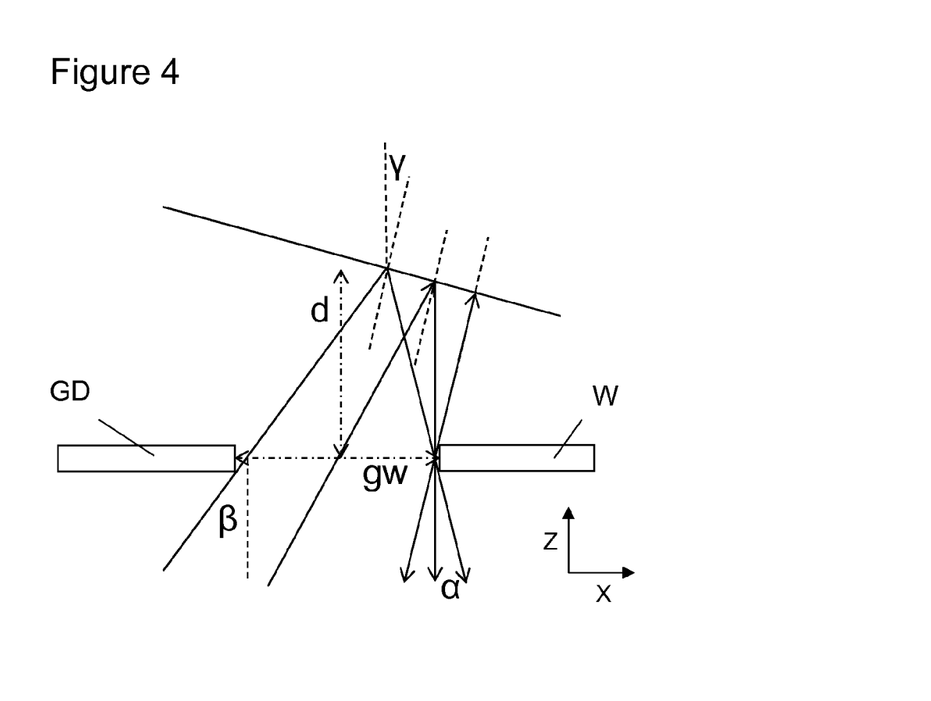
FIG. 4 depicts schematically a side view of the angles of radiation reflected by the reflective element of a sensor system according to an embodiment of the invention.

In FIG. 4, β is the illumination numerical aperture (NA) angle, α the angle of the reflected radiation, γ the reflective element tilt angle, gw the gap width between substrate W and the gripping device GD and d the height of the reflective element RE with respect to the gap width gw.

In general, edge shifts of the substrate edge WE in the substrate edge image WEI may occur when the NA around the substrate edge WE fluctuates, i.e. when the second reflection part RERP is only partly within the part of the radiation bundle LB projected on the reflective element RE for example due to underfilling of the NA, movement of the substrate or movement, e.g. vibration, of the mirror element and/or movement of the sensor or imaging system. To avoid these fluctuations, the angles a of the reflected radiation rays should always be close to, at least as large as, preferably larger than the imaging NA.

This is controlled via the combination of the illumination NA of the reflective element RE, reflective element tilt angle γ and imaging NA, the latter being controlled by the diaphragm opening of the diaphragm device LD. The angle of the reflected radiation α is related to the angle of the illumination radiation β via the reflective element tilt angle γ.

$$\beta = \alpha + 2\gamma$$

All reflected ray angles α are larger than the imaging NA if
1) the reflective element tilt angle γ is more than twice as large as β−α given that β is sufficiently large,
2) the gap width gw is sufficiently large as to let ray B pass after reflection to the edge of the substrate as governed by the equation:

$$gw > d \cdot (\alpha + \beta) = 2d \cdot (\alpha + \gamma)$$

In a practical embodiment, a proper configuration of the reflector/gap system could be:
Imaging NA: 0.025 NA
Reflector tilt angle γ: >0.7° (0.013 NA)
Illumination NA: >0.05 NA
Reflective element height; d≤45 mm
Gap width; gw: >3.8 mm In practice, the reflective element tilt angle γ may be at least 0.5, preferably at least 0.7 degrees with respect to the main direction of the radiation bundle LB, i.e. the z-direction in FIG. 4, wherein the lower side of the reflective element RE is arranged above the substrate W.

Figure 5:
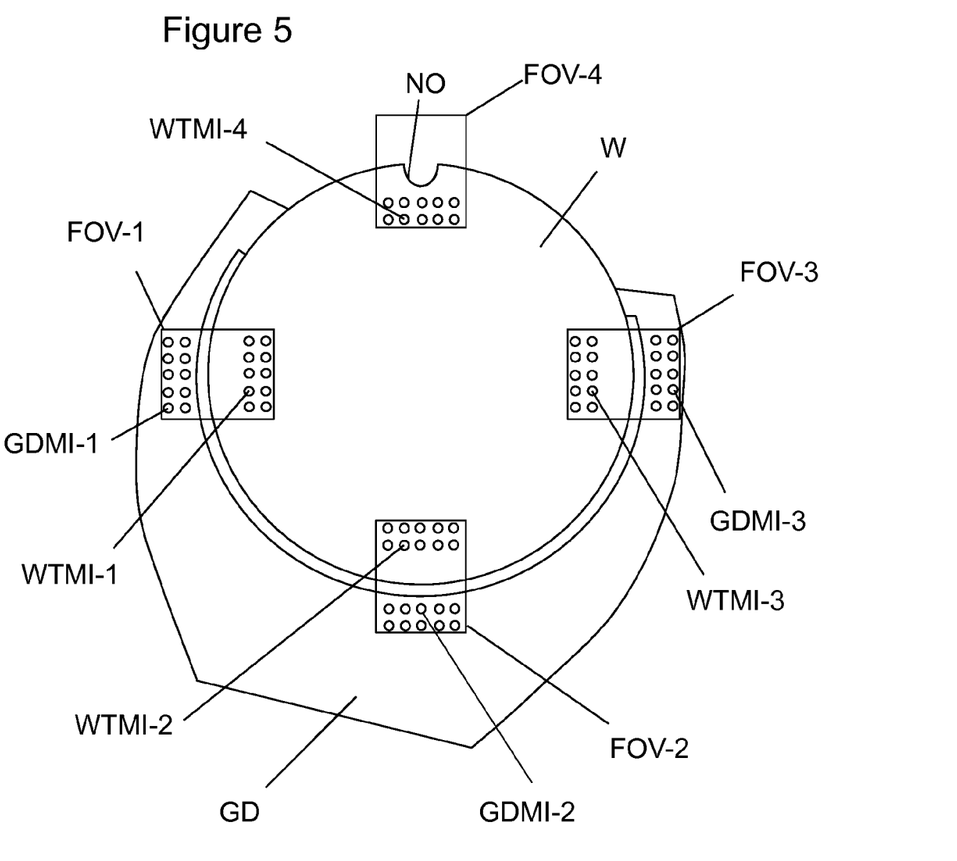
FIG. 5 depicts schematically a substrate held by a gripping device in a substrate handling system according to an embodiment of the invention.

FIG. 5 shows a gripping device GD holding a substrate W. The gripping device GD is arranged in a measurement position in which the substrate edge WE of the substrate W is in the field of view FOV of four sensor systems, as shown in FIG. 2. Indices 1, 2, 3 and 4 are used to indicate elements of the respective sensor system, e.g. FOV-1 is the field of view of a first sensor system and FOV-2 is the field of view of a second sensor system.

The substrate W in FIG. 5 comprises a notch NO to determine a rotational position of the substrate W. The location of this notch NO may be determined on the basis of the image of the substrate edge WE.

It is desirable to measure the position of the substrate W when it is held by the gripping device GD so that any positional errors that occur during correction of a position of a substrate on the pre-alignment substrate table PWT or during transfer of the substrate W from the pre-alignment substrate table PWT to the gripping device GD are determined by direct position measurement of the position of the substrate with respect to the gripping device GD. Therewith, propagation of the positional errors during transfer of the substrate can at least partially be avoided.

However, in some gripping devices GD, the gripping device GD does not physically extend to all field of views FOV of each of the sensor systems PSS. In such embodiment, it is not possible to mount, without extra measures, a gripping device mark GDM within the field of view of the respective sensor. In the example of FIG. 5, there is no gripping device mark GDM present in the field of view FOV-4 of the fourth sensor system. As a result, it is not possible to directly determine a relative position of the gripping device GD and the substrate edge WE using a gripping device mark image GDMI and a substrate edge image WEI within the field of view FOV-4 of this sensor system.

It is remarked that typically for each of the sensor systems PSS a substrate table mark WTM is arranged in the field of view of the respective sensor system PSS. Therefore, the positional mutual relationship of the four substrate table marks WTM may be used to determine the position of the gripping device GD with respect to the substrate edge WE in the respective fourth sensor system.

In such approach, the following steps can be taken to determine position of the substrate W with respect to the gripping device GD, when the substrate W is held by the gripping device GD in the measurement position.

First the substrate W is supported and arranged on a pre-alignment substrate table PWT. The position of the substrate W with respect to the substrate table WT is determined using the sensor systems PSS by measuring the position of the substrate W with respect to the substrate table marks WTM in the field of view FOV-1,2,3,4 of each of the sensor systems.

When desirable, the position of the substrate W may then be adapted, for example a rotational position of the substrate W can be adjusted by using a substrate rotating device WRD, as indicated in FIG. 2.

In a next step, the substrate W may be transferred from the substrate table PWT to the gripping device GD.

Once the substrate W is supported by the gripping device GD the position of the substrate W may again be determined, but now with respect to the gripping device GD.

If one of the sensor systems does not have a gripping device mark GDM in its field of view FOV, which is the case in the field of view FOV-4 of the fourth sensor system in FIG. 5, the substrate table marks WTM may still be measured for each of the sensor systems, since for each sensor system a substrate table mark WTM is within the field of view of one of the sensor systems.

By using the mutual positional relationship of the substrate table marks WTM, and the relative position of the gripping device mark GDM with respect to the substrate table mark WTM in the same field of view FOV of the first, second and third sensor system, the position of the gripping device with respect to the water table mark WTM can be determined. As a result, the position of the substrate edge WE within the field of view FOV-4 of the fourth sensor system may also be determined with respect to the gripping device GD.

It is remarked that the positional mutual relationship of the four substrate table marks WTM as measured by the sensor systems may change in the course of time as a result of displacements of the sensor systems with respect to each other, for example caused by temperature differences.

However, when these thermal effects are small, the positional mutual relationship of the four substrate table marks WTM may be determined at another point in time than the relative position of the gripping device GD and the substrate edge WE using a gripping device mark image GDMI and a substrate edge image WEI within the same field of view FOV.

Figure 6:
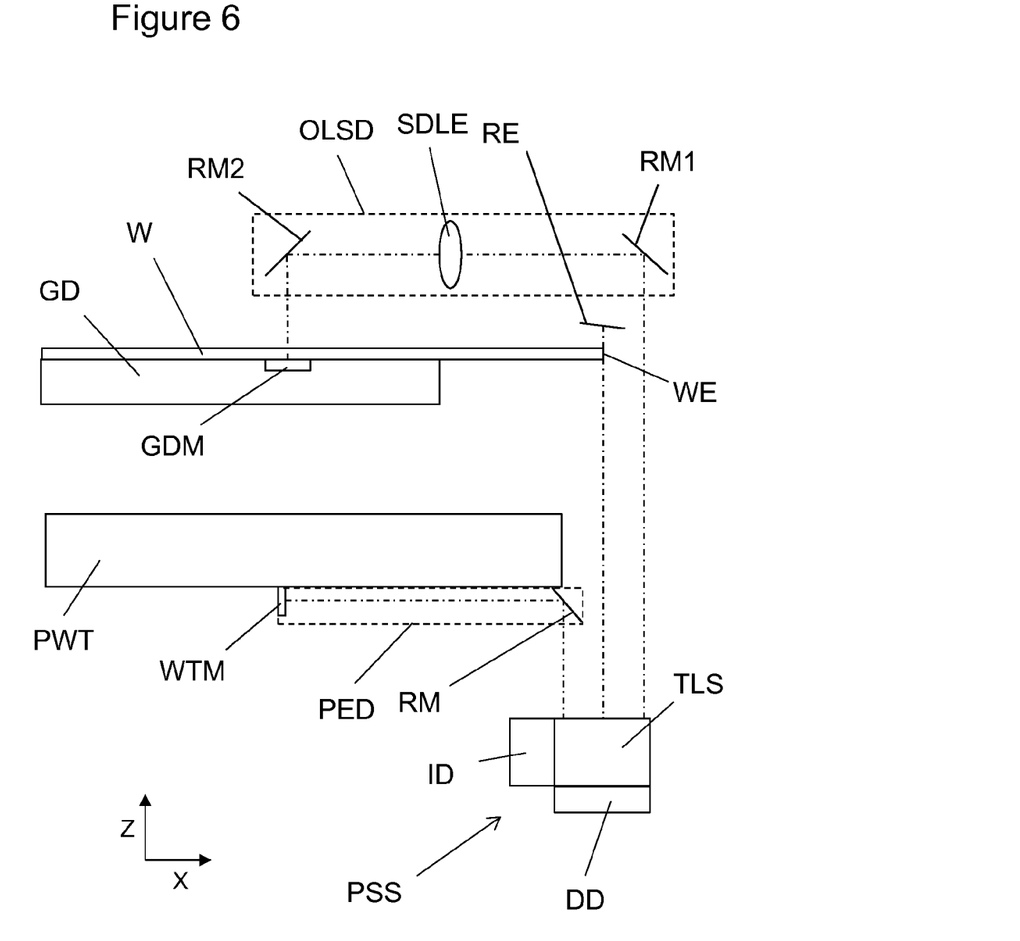
FIG. 6 depicts schematically a substrate held by a gripping device in a substrate handling system according to another embodiment of the invention.

FIG. 6 shows another possibility to determine a position of a substrate edge WE in a field of view of a sensor system PSS, when no gripping device mark GDM is physically present within the field of view of a sensor system PSS.

The sensor system PSS of FIG. 6 is generally the same as shown in FIG. 2, comprising a illumination device ID, an imaging system TLS and a detector device DD below the substrate W and a reflective element RE above the substrate W. Part of the radiation bundle emitted by the illumination device ID runs through the imaging system TLS towards the substrate edge WE, where a part of the radiation bundle is reflected by the substrate W and part of the radiation bundle is reflected by the reflective element RE as described with respect to the embodiment of FIG. 2.

Another part of the radiation bundle is used to be reflected from the substrate table mark WTM mounted on the pre-alignment substrate table PWT. Also similar to the embodiment of FIG. 2, an optical path extension device PED is provided to extend the optical path via the mirror surface RM in the x-direction to the substrate table mark WTM in order to avoid focus issues caused by the optical path difference, in the measurement direction, z-direction, between the imaging system TLS and the substrate edge WS and between the imaging system TLS and the substrate table mark WTM.

In the arrangement of FIG. 6, the gripping device mark GDM is not within the field of view of the sensor system PSS, and the gripping device GD physically does not extend in the field of view of the sensor system PSS. As a result, a gripping device mark GDM cannot easily be mounted in the field of view of the sensor system PSS. Therefore, in the embodiment of FIG. 6, an optical location shift device OLSD is provided in the substrate handling system to project the gripping device mark GDM in the field of view of the sensor system.

The optical location shift device OLSD comprises two optical elements RM1 and RM2, each having a mirror surface mounted at an angle of approximately 45 degrees with respect to the z direction. As a result, the gripping device mark image GDMI of the gripping device mark GDM is shifted in the x-direction into the field of view of the sensor system PSS with the result that the sensor system PSS can directly determine a relative position of the substrate edge WE with respect to the gripping device GD using the substrate edge image WEI and the gripping device mark image GDMI.

In the embodiment shown in FIG. 6, the use of the optical location shift device OLSD results in a longer optical path of the radiation bundle from the imaging system TLS to the gripping device mark GDM compared with the optical path from the imaging system TLS to the substrate edge WE. To compensate for the focus issues that may arise from this longer optical path, a shift device lens element SDLE is provided in the optical location shift device OLSD. This shift device lens element SDLE is selected to provide a focused radiation bundle at the location of the gripping device mark GDM while at the same time, the substrate edge WE is in the focus range of the imaging system TLS.

The optical location shift device OLSD may be mounted at any suitable location for instance on the pre-alignment substrate table PWT or the gripping device GD, where it should have a relatively stable position with respect to the pre-alignment substrate table PWT and the gripping device GD. Since the optical location shift device OLSD only comprises optical elements without any heat sources such as electricity, the stable position is not or less influenced by temperature effects in the optical location shift device OLSD.

In an embodiment there is provided a sensor system configured to determine a position of a substrate edge and/or a rotational position of a substrate. The sensor system comprises a radiation source, a reflective element and detector device. The radiation source is configured to emit a radiation bundle. The radiation source and the detector device are arranged at a first side of the substrate. The reflective element is arranged at a second side of the substrate opposite to the first side. The radiation source is configured and arranged to emit the radiation bundle to the substrate edge. A first part of the radiation bundle is emitted to and reflected by the substrate so as to create a reflected first part. The reflective element is arranged to receive and reflect a second part of the radiation bundle so as to create a reflective second part. The radiation source and the reflective element are positioned relative to each other such that an image of the substrate edge is comprised in the reflected first part and the reflected second part. The detector device is arranged to receive the reflected first part and the reflected second part.

The reflective element may be arranged to direct the reflective second part adjacent to the substrate edge towards the detector device.

The sensor system may comprise a substrate mark arranged on the substrate. The substrate mark is arranged to receive and reflect the first part of the radiation bundle, such that an image of the substrate mark is comprised in the reflected first part.

The sensor system may comprise a supporting device mark arranged on a supporting device configured to support the substrate. The supporting device mark, in a measurement position, is arranged to receive and reflect a third part of the radiation bundle so as to create a reflected third part. An image of the supporting device mark is comprised in the reflected third part.

The supporting device may be a gripping device configured to transfer a substrate to or from a substrate table configured to hold the substrate.

The sensor system may comprise a substrate table mark arranged on the substrate table. The substrate table mark is arranged to receive and reflect a fourth part of the radiation bundle so as to create a reflected fourth part. An image of the substrate table mark is comprised in the reflected fourth part.

The sensor system may comprise an optical path extension device to compensate for a radiation path length difference between a path length of the reflected first part and a path length of the reflected second part.

The sensor system may comprise a further optical path extension device to compensate for a further radiation path length difference between a path length of the reflected first part and a path length of the reflected third part. The further radiation path extension device may comprise an optic element configured to redirect the reflected third part or elongate the path length of the reflected third part.

The reflective element may comprise a mirror element. The mirror element may be arranged non-perpendicular with respect to a main direction of the second part of the radiation bundle falling on the mirror element. A tilt angle of the mirror element with respect to a main direction of the second part of the radiation bundle falling on the mirror element may be at least 0.5, preferably at least 0.7 degrees.

The sensor system may comprise an imaging system. The radiation source may be configured and arranged to emit the radiation bundle via the imaging system to the substrate edge and/or wherein the detector device is arranged to receive the reflected first part and the reflected second part via the imaging system. The imaging system may be a telecentric imaging system. In an embodiment, there is provided a position measurement system configured to determine a position of a substrate held by a gripping device. The position measurement system comprises a substrate table, a gripping device and two sensor systems. The substrate table is configured to support a substrate. At least a first substrate table mark and a second substrate table mark are arranged on the substrate table. The gripping device is configured to hold the substrate. The gripping device is configured to transfer the substrate to or from the substrate table. A gripping device mark may be arranged on the gripping device. The two sensor systems are configured to determine an edge position of the substrate. Each sensor system comprises a field of view. The first substrate table mark is arranged within the field of view of one of the two sensor systems. The second substrate table mark is arranged within the field of view of another of the two sensor systems. In a measurement position of the gripping device, the gripping device mark is in the field of view of one of the two sensor systems. The position measurement system is configured to determine, when the substrate is supported by the substrate table, a position of the substrate with respect to the substrate table using the two sensor systems. When the substrate is subsequently held by the gripping device, the position measurement system is configured to determine, for a sensor system without a gripping device mark in its field of view, a position of this sensor system with respect to the gripping device by using a mutual positional relationship of the first and second substrate table marks, and a relative position of the gripping device mark and the first or second substrate table mark in the same field of view of one of the two sensor systems.

The position measurement system may comprise two, preferably three or more sensor systems PSS as described above. The position measurement may comprise an optical location shift device comprising a number of optical elements configured to project a gripping device mark GDM in the field of view of one of the two sensor systems PSS, when the gripping device mark itself is not physically arranged in the field of view of one of the two sensor systems PSS. The optical location shift device preferably comprises a shift device lens element to bring the gripping device mark in a field of focus of the respective one of the two sensor systems PSS. In an embodiment there is provided a method to determine a position of a substrate W held by a gripping device GD using the position measurement system described above. Said method may comprise: i) supporting the substrate on the substrate table, ii) determining a position of the substrate W with respect to the pre-alignment substrate table PWT using the two sensor systems PSS by measuring the position of the substrate W with respect to the first and second substrate table marks, iii) transferring the substrate W from the pre-alignment substrate table PWT to the gripping device GD, iv) determining for the sensor system PSS without a gripping device mark in its field of view, a position of this sensor system with respect to the gripping device by using the mutual positional relationship of the first and second substrate table marks, and a relative position of the gripping device mark and the first or second substrate table mark in the same field of view of one of the two sensor systems, v) determining a position of the substrate with respect to the gripping device using the two sensor systems.

In an embodiment there is provided a lithographic apparatus comprising the position measurement system as stated above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A system configured to determine a position of a substrate having an edge, the system comprising:
   a radiation output arranged to emit a radiation bundle;
   a reflective element;
   a detector device;

an imaging system; and a substrate table having a supporting surface arranged to support the substrate, the supporting surface is at least partly along a plane, wherein the radiation output and the detector device are arranged on a first side of the plane, and the reflective element is arranged on a second side of the plane other than the first side, wherein the reflective element is arranged to create a reflected bundle by reflecting at least part of the radiation bundle and to illuminate the edge with the reflected bundle, wherein the imaging system is arranged to propagate the reflected bundle so as to project an image of the edge on the detector device, and wherein the imaging system is arranged to propagate a second reflected bundle created by reflection of at least part of the radiation bundle from a mark so as to project an image of the mark on the detector device, the mark being located on the substrate table or on a gripper device configured to transfer the substrate to, or from, the substrate table.

2. The system of claim 1, wherein the reflective element is arranged to illuminate the edge with the reflected bundle with an illumination numerical aperture, wherein the imaging system is arranged to project the image on the detector device with an imaging numerical aperture, and wherein the illumination numerical aperture is larger than the imaging numerical aperture.

3. The system of claim 2, wherein the illumination numerical aperture is at least two times larger than the imaging numerical aperture.

4. The system of claim 1, wherein the mark is arranged on the substrate table.

5. The apparatus of claim 4, wherein the mark is further arranged on the gripper device.

6. The system of claim 1, comprising an optical path extension device arranged to extend a length of the reflected bundle and/or the second reflected bundle.

7. The sensor system of claim 1, wherein the radiation output is arranged to illuminate, with at least part of the radiation bundle, a substrate mark, the substrate mark arranged on the substrate and arranged to create a third reflected bundle by reflecting at least part of the radiation bundle, wherein the imaging system is arranged to propagate the third reflected bundle so as to project an image of the substrate mark on the detector device.

8. The system of claim 1, wherein the imaging system comprises a telecentric imaging system.

9. The system of claim 1, wherein the reflective element comprises a mirror.

10. The system of claim 9, wherein the radiation output is arranged to emit the radiation bundle toward the reflective element along a main direction, wherein the mirror is arranged non-perpendicularly relative to the main direction.

11. The system of claim 10, wherein the mirror is, relative to the main direction, at an angle of at least 0.5 degrees.

12. The system of claim 1, wherein the substrate table is arranged to rotate the substrate from a first orientation to a second orientation, wherein in the first orientation a first portion of the edge is illuminated by the reflective element, wherein in the second orientation a second portion of the edge is illuminated by the reflective element, wherein the first portion is different from the second portion.

13. A substrate handling system, comprising the system of claim 1, further comprising the gripping device configured to transfer the substrate to, or from, the substrate table, wherein the gripping device comprises a gripper mark, wherein the radiation output is arranged to illuminate with the radiation bundle the gripper mark, wherein the gripper mark is arranged to create a fourth reflected bundle by reflecting at least part of the radiation bundle, and wherein the imaging system is arranged to propagate the fourth reflected bundle so as to project an image of the gripper mark on the detector device.

14. A lithographic apparatus, comprising the system of claim 1, further comprising a projection system arranged to project a pattern on the substrate.

15. A method to determine a position of a substrate having an edge, the method comprising:

emitting a radiation bundle from a radiation output, the substrate supported by a supporting surface that is at least partly along a plane and wherein the radiation output and a detector device are arranged on a first side of the plane, and the reflective element is arranged on a second side of the plane other than the first side;

creating a reflected bundle by reflecting at least part of the radiation bundle using the reflective element;

illuminating the edge with the reflected bundle from the reflective element;

propagating the reflected bundle using an imaging system so as to project an image of the edge on the detector device, creating a second reflected bundle by reflecting at least part of the radiation bundle using a mark, the mark being located on a structure having the supporting surface or on a gripper device configured to transfer the substrate to, or from, the supporting surface; and propagating the second reflected bundle using the imaging system so as to project an image of the mark on the detector device.

16. The method of claim 15, wherein the reflective element is arranged to illuminate the edge with the reflected bundle with an illumination numerical aperture, wherein the imaging system is arranged to project the image on the detector device with an imaging numerical aperture, and wherein the illumination numerical aperture is larger than the imaging numerical aperture.

17. The method of claim 15, wherein the mark is arranged on the structure having the supporting surface.

18. The method of claim 15, comprising create a third reflected bundle by reflecting at least part of the radiation bundle using a substrate mark arranged on the substrate, and propagating the third reflected bundle using the imaging system so as to project an image of the substrate mark on the detector device.

19. The method of claim 15, wherein the imaging system comprises a telecentric imaging system.

20. The method of claim 15, wherein the mark is arranged on the gripper device.

* * * * *